United States Patent
Fatehi et al.

(10) Patent No.: US 7,834,303 B2
(45) Date of Patent: Nov. 16, 2010

(54) MULTI-ELEMENT CONCENTRATOR SYSTEM

(75) Inventors: Mohammad Taghi Fatehi, Irvine, CA (US); Fareed Sepehry-Fard, Saratoga, CA (US)

(73) Assignee: Ahura Energy Concentrating Systems, Saratoga, CA (US)

( * ) Notice: Subject to any disclaimer, the term of this patent is extended or adjusted under 35 U.S.C. 154(b) by 213 days.

(21) Appl. No.: 12/135,655

(22) Filed: Jun. 9, 2008

(65) Prior Publication Data

US 2009/0302199 A1 Dec. 10, 2009

(51) Int. Cl.
*G01J 1/20* (2006.01)
*F24J 2/10* (2006.01)
*F24J 2/38* (2006.01)

(52) U.S. Cl. .................. 250/203.4; 126/578; 126/600; 126/684

(58) Field of Classification Search ............... 250/203.4; 136/246; 126/573, 578, 600, 684
See application file for complete search history.

(56) References Cited

U.S. PATENT DOCUMENTS

| | | | | |
|---|---|---|---|---|
| 4,172,443 A | * | 10/1979 | Sommer | 126/680 |
| 4,296,731 A | * | 10/1981 | Cluff | 126/578 |
| 4,700,013 A | * | 10/1987 | Soule | 136/248 |
| 4,968,355 A | * | 11/1990 | Johnson | 136/246 |
| 5,131,955 A | * | 7/1992 | Stern et al. | 136/245 |
| 5,166,832 A | * | 11/1992 | Zychowicz | 359/841 |
| 5,180,441 A | * | 1/1993 | Cornwall et al. | 136/246 |
| 6,091,017 A | * | 7/2000 | Stern | 136/246 |
| 6,364,496 B1 | * | 4/2002 | Boddy et al. | 359/877 |
| 6,485,152 B2 | * | 11/2002 | Wood | 359/853 |
| 6,972,659 B2 | * | 12/2005 | von Behrens et al. | 337/139 |
| 2004/0031483 A1 | * | 2/2004 | Kinoshita | 126/574 |
| 2009/0302199 A1 | * | 12/2009 | Sepehry-Fard et al. | 250/203.4 |
| 2010/0059042 A1 | * | 3/2010 | Chang et al. | 126/573 |

* cited by examiner

*Primary Examiner*—John R Lee
(74) *Attorney, Agent, or Firm*—The Law Offices of Andrew D. Fortney; Andrew D. Fortney

(57) ABSTRACT

A novel concentrator system is described, which increases the efficiency of collecting sunlight energy and concentrates it on a target. This method uses an array of small movable reflective or refractive concentrator components that can move via a feedback mechanism which tracks the sun and concentrates the suns energy on to a second array of energy converting elements. In order to improve the effective collected energy, the array of concentrator elements is placed on a moving or tiltable flat slab (or dish, substrate, plane, plate, holder, tablet, or similar flat or non-flat surface) that tracks the sun. An alternative method uses an array of target elements or linear elements and a second array of concentrator elements in harmony such that and suns energy is efficiently redistributed by the reflective/reactive array on to the energy converting array as the sun's position in the sky (elevation and azimuth) changes. The elements of the reflective/refractive array are tilted by novel actuation mechanisms describe herein.

60 Claims, 7 Drawing Sheets

Structure of Each Element
electrostatic embodiment,
E.g., T is proportional to (-x voltage) − (+X voltage)

Structure of Each Element
electrostatic embodiment,
E.g., T is proportional to (-x voltage) − (+X voltage)

MULTI-ELEMENT CONCENTRATOR SYSTEM

BACKGROUND OF THE INVENTION

Sun is a clean renewable source of energy. One of the effective usages of Sun's energy is concentrating its light on a target via reflective (mirrors) or refractive (lens) concentrators. We can concentrate sunlight using reflecting mirrors, refraction (lens), parabolic mirror or lens, one big, or large number of smaller ones, on a slab, or on double slabs, tiltable, moveable, or with rotation. The target can be solar cell, water heating reservoir or pipe, fuel cell reactor, Photosynthesis element, etc. We would produce under 1.7 cents/kWhr, for power generation, without the tolls on the environment.

In order to collect more energy, it is advantageous to keep the Alpha to a small value, even when sun is moving, as shown in FIG. 1. This often requires aligning the vertical axis of the reflective or refractive elements toward the sun, such as tilting or moving those elements, when the sun moves.

The following types of concentrators are commonly used to maximize the collected sunlight energy:

1. Reflective or refractive element (panel/surface/plate/dish)
2. Array of small parabolic reflective or refractive elements on a flat-panel (dish)
3. Array of small flat reflective or refractive elements on a parabolic-panel (dish)

All the above panels or dishes usually have tracking systems that track the sun and point the dish toward the sun. The above mentioned concentrators suffer from the fact that large and heavy panels (dishes) need to move constantly to track the sun. Such kind of movement requires electric motors and gearbox, which consume power and are prone to failure.

SUMMARY OF THE INVENTION

A concentrator system is described, which increases the efficiency of collecting sunlight energy and concentrating it on a target (or targets). This method uses an array of small movable reflective or refractive concentrator components that tilt about or move in two axes (X and Y) via X-direction and Y-direction control processors. The X and Y control processors produce signals proportional to the angle of sun rays to the axis of the concentrator system using a differential tracking system. The array of concentrating elements could be installed on a moving flat slab (dish), which can then track the sun and therefore better align the concentrator elements toward the sun. This method ensures highly efficient concentrating of sun energy through a day from morning till afternoon.

As an alternative to moving slab (dish) an array of target elements such as photocells or linear elements such as pipe are placed above the concentrator elements, which ensures that the sunlight is concentrated efficiently throughout the day by concentrating the sunlight on different point target elements or different linear target elements, when the sun moves.

DETAILED DESCRIPTION OF THE PREFERRED EMBODIMENTS

Three novel types of concentrator systems are described in this document that concentrates the sunlight on to a "Target" very effectively. The Target can be solar cell, water heating reservoir or pipe, fuel cell reactor, Photosynthesis element, etc.

Figure 1:
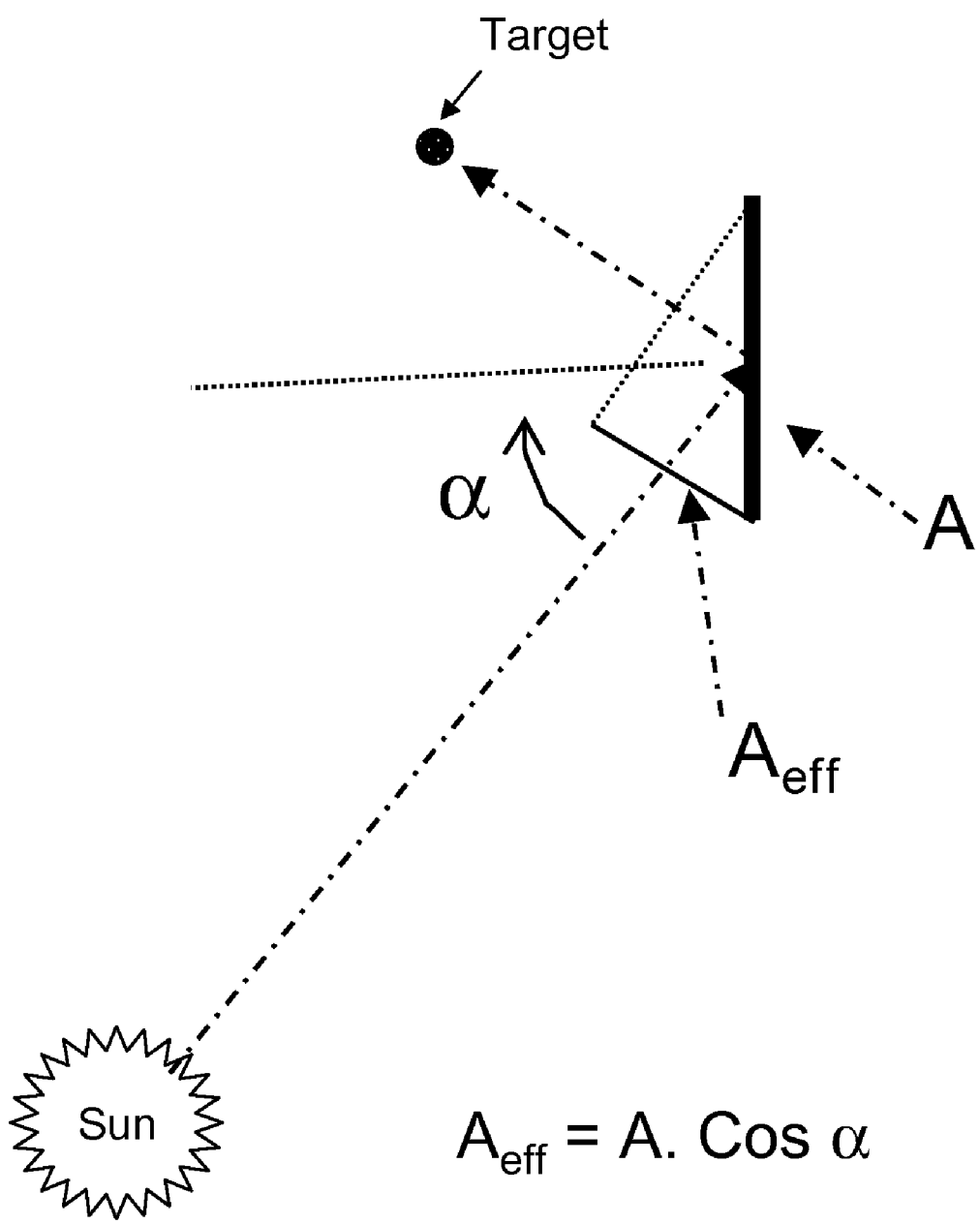
FIG. 1 shows the angle Alpha and the effective concentrator elemental surface area (Aeff)
Figure 2:
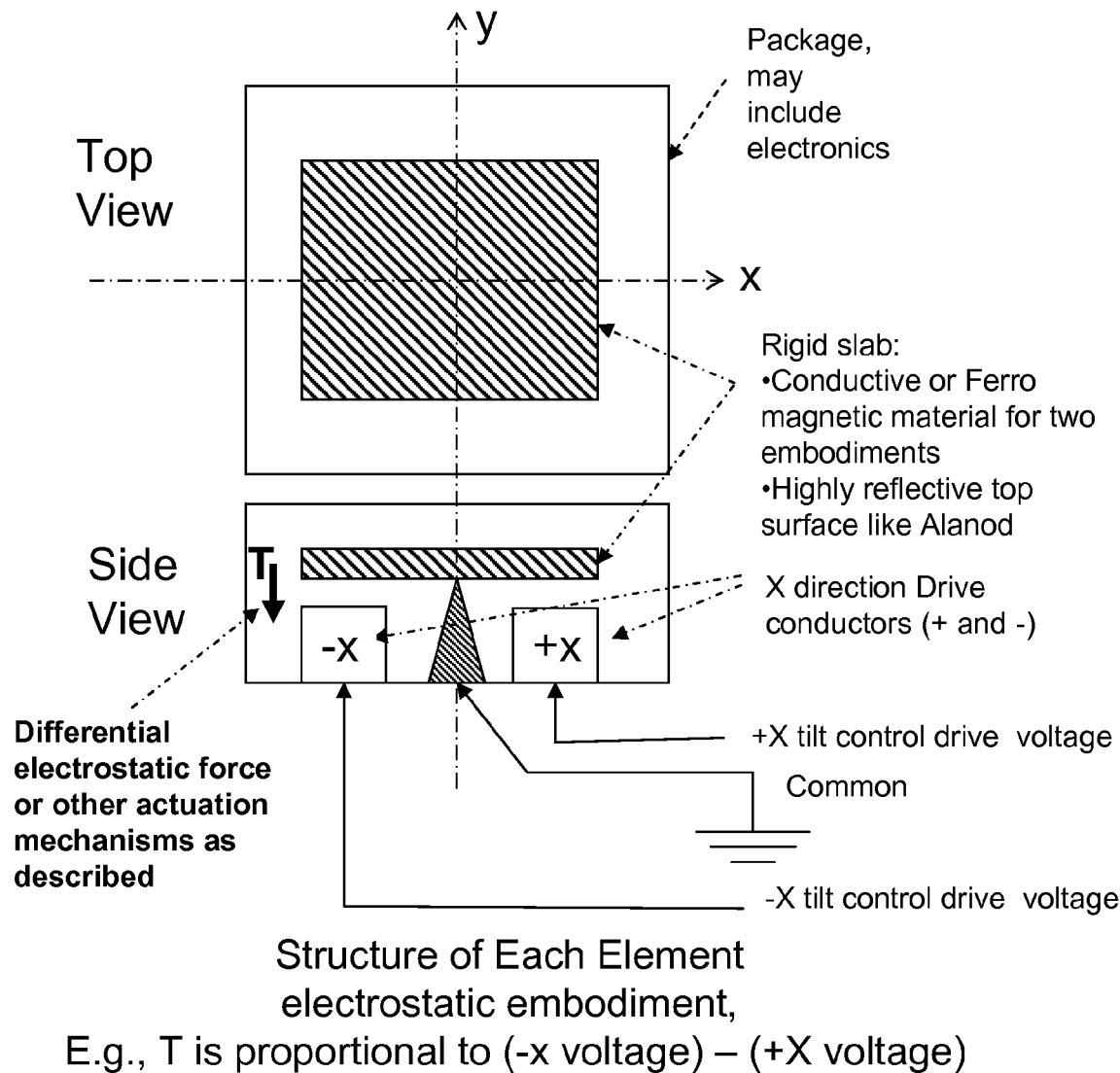
FIG. 2 shows one of the reflective elements that include the slab (mirror) and an electrostatics actuation mechanism for tilting the mirror.

A typical concentrating element is illustrated in FIG. 2. The concentrator comprises of an array of small flat reflective (mirror) or refractive (lens) elements called "concentrating elements. Each concentrating element has a mechanism that can tilt it in one or two axis (X and Y). The movement of concentrating elements in X or Y axis are controlled by a feedback mechanism, which aligns the vertical axis of each concentrator system with the sun, while still concentrating the maximum amount of energy on the Target. A differential tracker is connected to two (or more) Photo Detectors (PD), which are located at a distance from each other. The differential tracker creates a differential signal that is fed to a tracking and control processor, which in turn commands the X and Y direction control processors to tilt the concentrating elements in X or Y axis. The advantage of such a concentrating system is that it has smaller moving parts that require very little moving power and the failure of the moving system of any of the reflective elements has negligible effect on the overall concentrated energy. However, this type of concentrator system suffer from the Cosine of Alpha problem in the early morning or late afternoon, due to the large (azimuth) angle of the sun makes with respect to the normal to the concentrator element at the extremes (new sunrise and sunset). This geometry is shown in FIG. 1.

Figure 3:
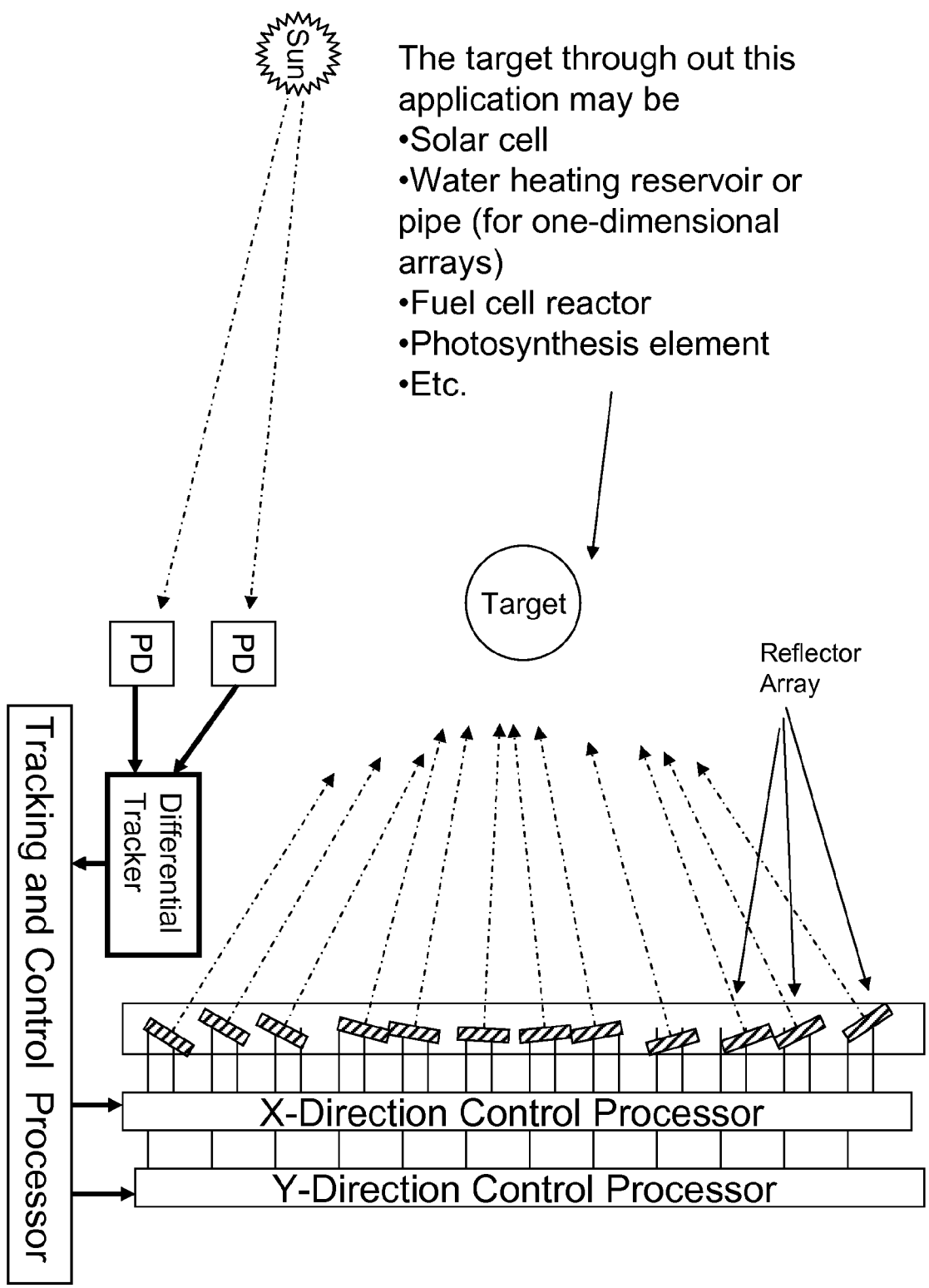
FIG. 3 shows a first type of concentrator system with an array of small mirrors, which are tilted individually, via a feedback mechanism, to track the sun.

FIG. 3 shows the structure of a reflective concentrator system, along with FIG. 2 (showing the concentrator element). It consists of a two-dimensional array of conductive or Ferro magnetic material that has a highly reflective top surface such as Alanod. There are two X direction drive conductors (FIG. 2), which are connected to +X tilt and −X tilt control drive voltage. One of the following actuation mechanisms is used to tilt the slab:

1) Electro static force [using two (or one) chargeable plate (s)]. The differential electrostatic force will tilt each mini-mirror to the desired angle under feedback control.

2) Magnetic force [using two (or one) solenoid(s)]. The differential magnetic force, combined with appropriate spring tensions will tilt each mini-mirror to the desired angle under feedback control.

3) Servo control mechanism [using ONE (or more) miniature motor(s)]. The miniature electric motor(s), combined with spring tensions (with dampers) will tilt each mini-mirror to the desired angle under feedback control.

4) The strain experienced in alloys called Shape Memory Alloys (SMA) also known as muscle wire as a result of controlled heating and other excitations.

Clearly, there are other actuating mechanisms that are also possible and can be envisioned by someone skilled in the art.

Figure 4:
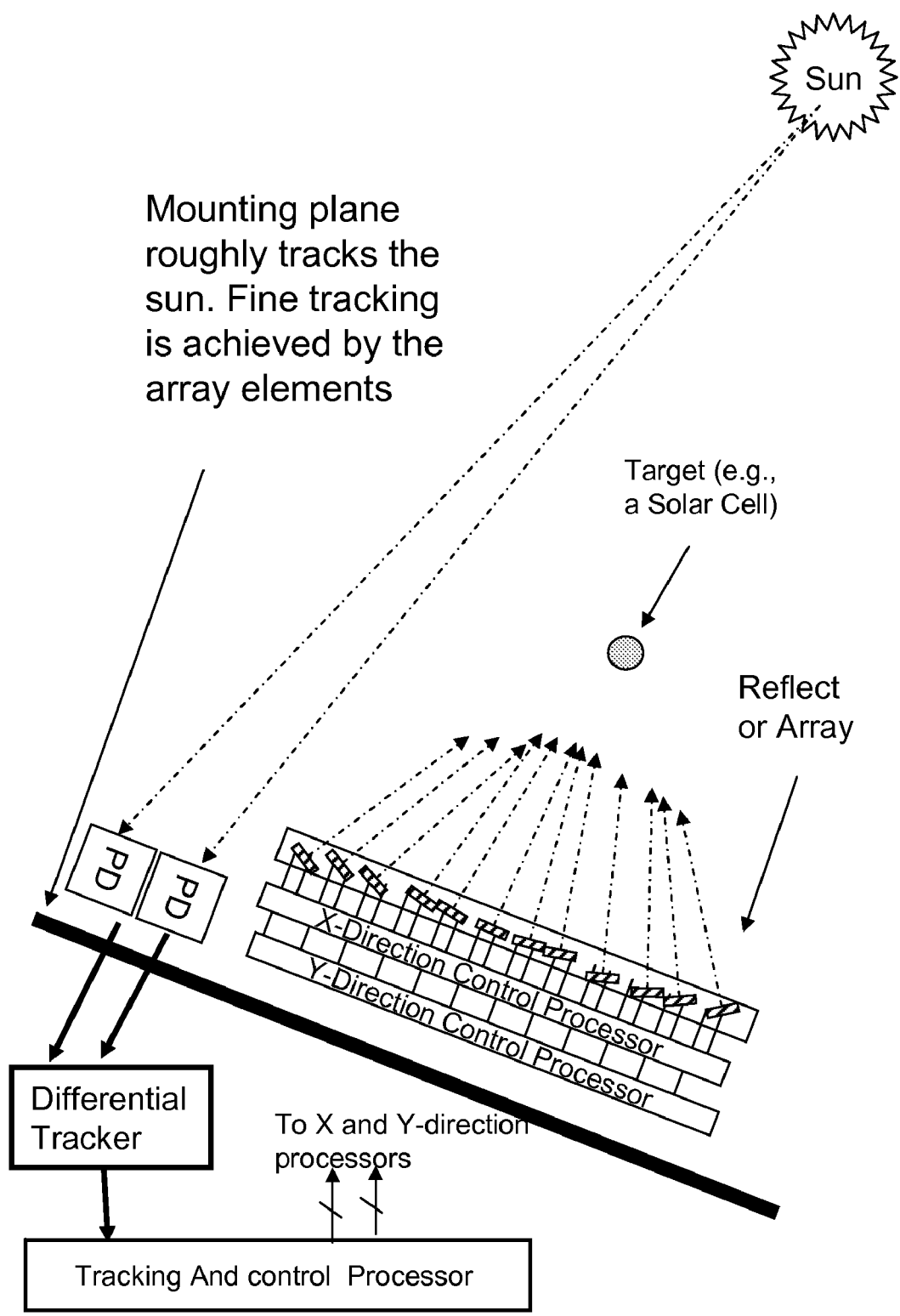
FIG. 4 shows a second type of concentrator system with an array of small mirrors and a movable or tiltable slab (dish). Individual mirrors as well as the dish are tilted via a feedback mechanism to track the sun.

The second concentrator system is illustrated in FIG. 4. This concentrator is similar to the first concentrator shown in FIG. 3, and comprises of the same elements and components, but in this concentrator system a flat panel (dish) holds the small concentrator elements. The dish is movable and tracks the moving of the sun, in such a way that roughly aligns the vertical axis of the dish with the sunlight. The moving of the dish results in a lower angle (Alpha) between the sunlight and the vertical axis of small concentrator elements, which causes more energy to be concentrated on the target and therefore increase the efficiency of the whole concentrator system. In this embodiment, the concentrator elements perform the functions of fine alignment as well as focusing of the energy onto the target.

The third concentrator system consists of an array of concentrators similar to the first and second concentrator systems shown in FIGS. 3 and 4 double array arrangements: An array of target elements and another array of concentrator elements separated by a distance in the Z direction. The Target is also a single or two-dimensional Array of Targets such as an array of solar cells, or a linear target element such as a heat pipes for thermal plants, in which a fluid is running and absorbs the generated heat, as a result of solar concentration.

Figure 5:
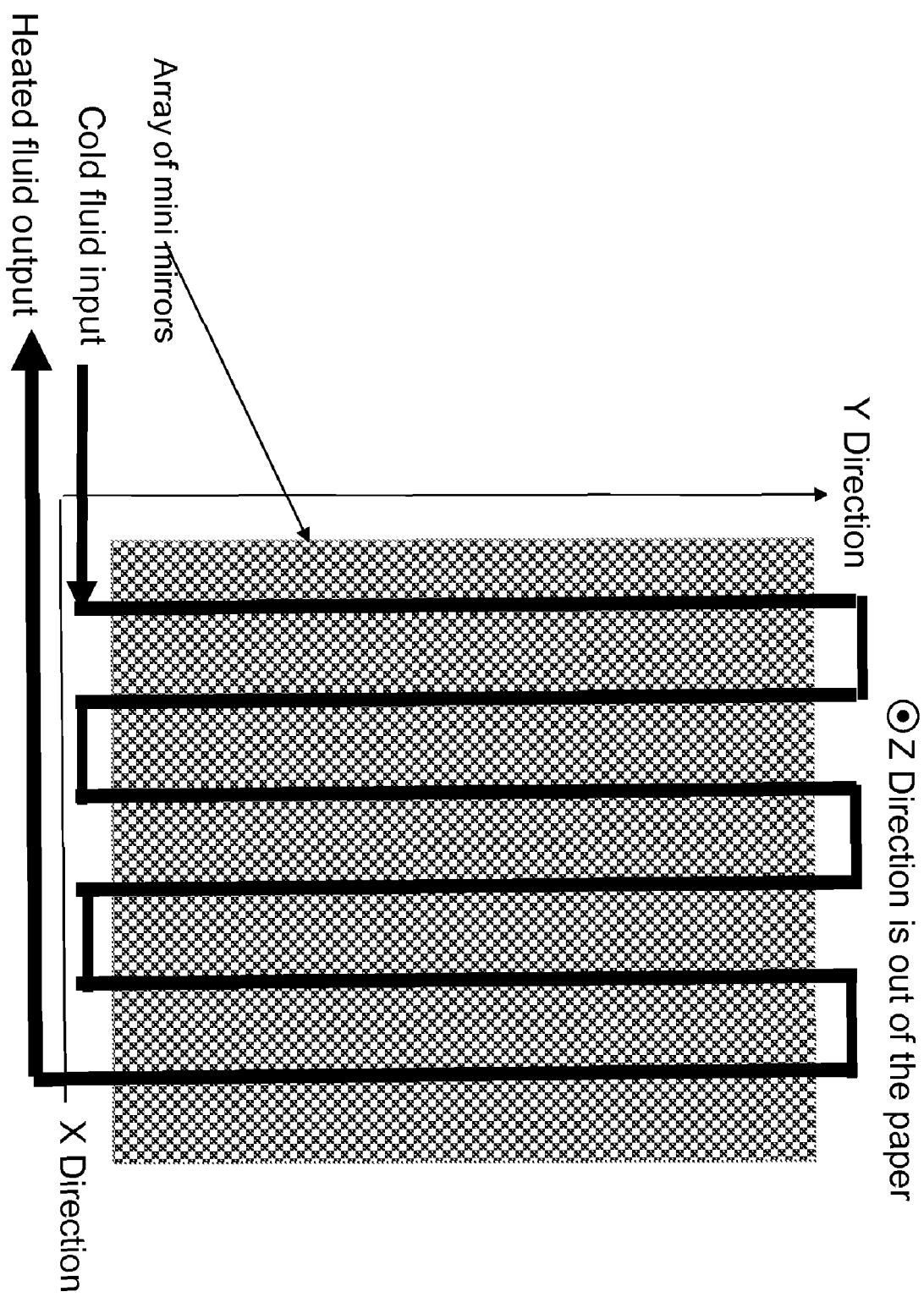
FIG. 5 shows a third type of concentrator system made up of an array of mirrors, with re-circulating fluid pipe above it as linear target to absorb the reflected energy from the mirrors.
Figure 6:
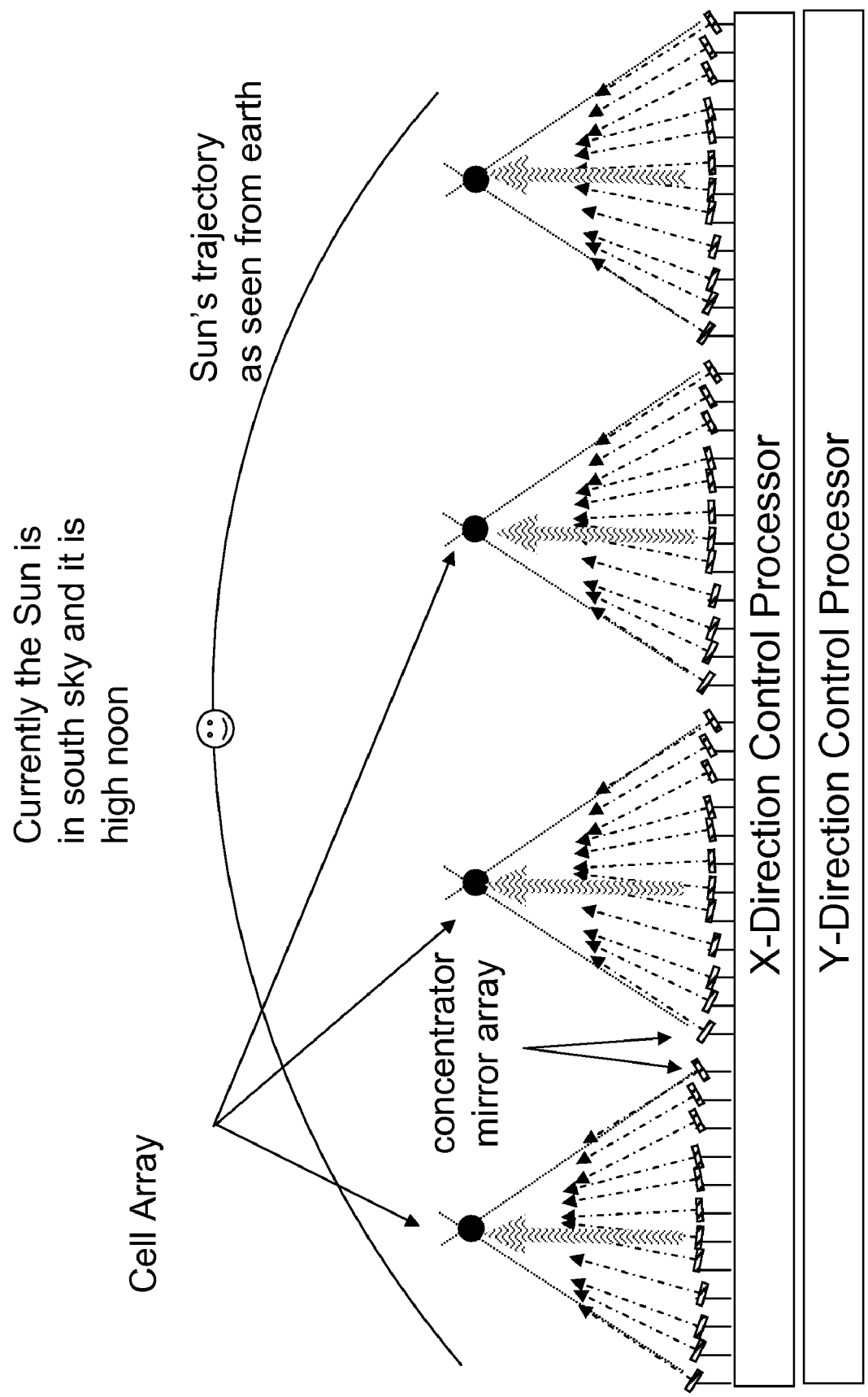
FIG. 6 shows the operation of concentrator system, the position of sun in midday in its trajectory of the apparent or relative movement, spanning from left to right, East to West, in the sky.

FIG. 5 shows an example of a two dimensional linear concentrator array of heat pipes used for energy generation, such as in a power plant. The elements to be heated are not points (Cells), but rather lines (pipes). The dimensions of pipes in one of the direction (y direction in the case shown in FIG. 5) are much larger than the dimensions of cells, so that only in one direction, we need to focus, and there is no need to focus on the second orthogonal direction, along the length of the pipe. These pipes have fluids (liquids) running through them that is used to absorb the concentrated heat, which could then be used in thermal power pants. FIG. 5 shows the top view of such concentrator system from the Z axis. FIG. 6 shows the side view of such a concentrator system, when the sun is right above the target array at high noon. As the sun moves from the east to the west, the alignment of each mini-mirror to the target element changes, so that to maximize the sun's irradiance on the surface.

Figure 7:
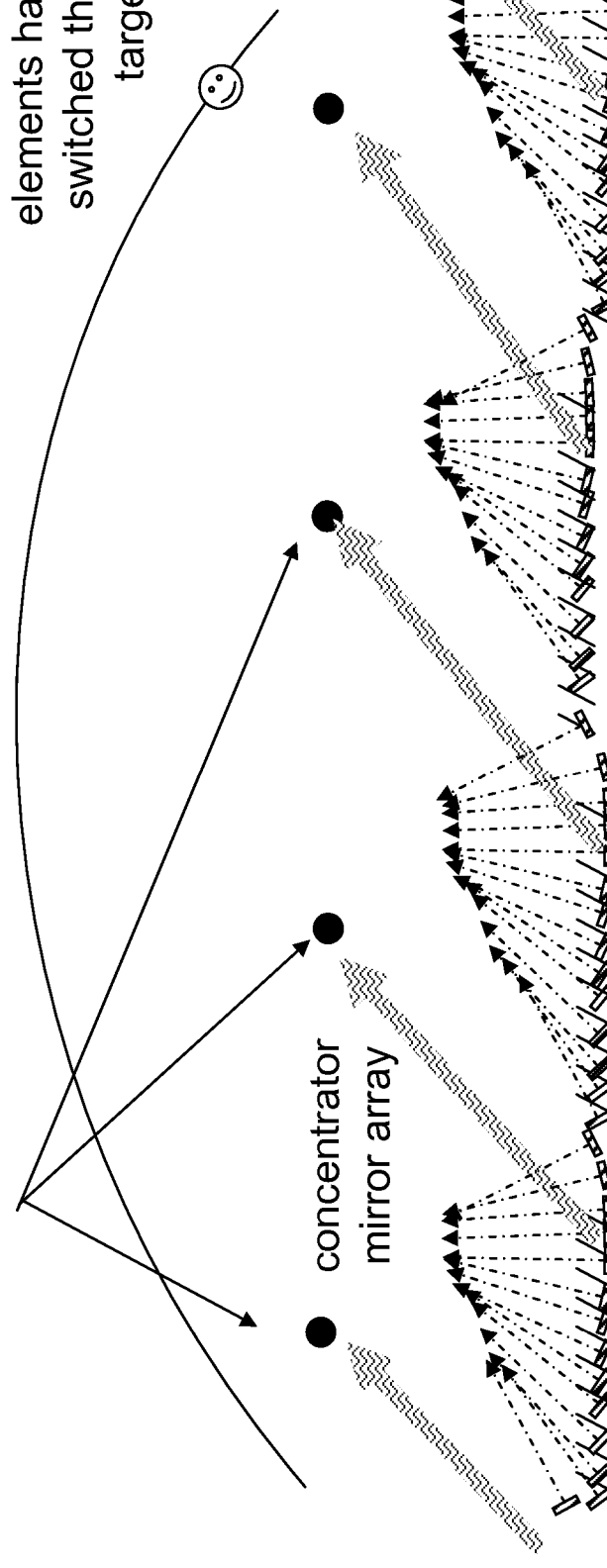
FIG. 7 shows the operation of concentrator system, the position of sun in sunset in its trajectory of the apparent or relative movement, spanning from left to right, East to West, in the sky.

FIG. 7 shows the same scenario but near sunset when the sun is in a westerly point. Since there is no moving dish or slab in this type of concentrator system, the optimum tilt for the concentrating elements may not result the sun rays to be concentrated on the target (i.e., the target area or point that they pointed to at noon time shown in FIG. 6). Rather the optimum tilt of the concentrating elements will concentrate the rays on one of the neighbor target areas or points on the target array. This technique is very effective especially when the target is a linear target element such as heat pipe, since concentrating the sunlight to anywhere in the pipe would still heat the fluid in the pipe. Similar to the first concentrator system shown in FIG. 2, the advantage of such a concentrating system is that it has smaller moving parts that require very little moving power and the failure of the moving system of any of the reflective elements has negligible effect on the overall concentrated energy, and hence generated power. However, the advantage of the third type of concentrator system described above compared to the first concentrator system is that it does not suffer from the Cosine of Alpha problem, in the morning or afternoon when the Alpha angle is large.

Different actuation methods can be used to tilt the each element of the concentrator arrays in any direction. Mirror arrays on a rotating slab can be used. The double arrays of mirrors and cells can be used. One embodiment concerns with an apparatus or method to provide for a "Energy Transceiver", which relates to the magnetic motor/generator based on permanent and/or electro magnets. It also addresses a software defined "Energy Transceiver"/magnetic motor/magnetic-based generator, by means of permanent magnets and/or electromagnets in an attraction and/or repulsion mode. It also relates to the means to monitor the permanent magnet force to provide for high power voltage to renew/increase the magnetic force within the magnet, using the solar cells energy build up within a storage device, such as huge capacitor, but not limited to huge capacitor.

Another embodiment would utilize electrostatic forces to tilt the elements as shown in FIG. 2. Yet another embodiment of tilt actuation utilizes certain alloys called Shape Memory Alloys (SMA) also known as muscle wire. In SMAs, a significant amount strain is experienced as a result of controlled heating and other excitations of the alloy. The differential strain in a number of such actuators would be used to accurately position the tilt angles of each concentrator element.

Clearly, there other actuating mechanisms that also possible and can be envisioned by someone skilled in the art.

Synchronization of the tracker with atomic clock in Colorado and the GPS signal: In the case of Atomic clock, a very inexpensive AM or FM modulation, but not limited to these two, can send signals to the tracker via UHF broadcast transmitters or paging networks, but not limited to these two, every ½ hour or so, to enable the tracker to adjust itself to the sun. Same alignment can be done using the week signal of the GPS which can be as little as −134 dBm, but not limited to this number, to synchronize the tracker to align the sunshine to the concentrator system.

A database that according to the geographical location of the concentrator and the time of the year will adjust the concentrator system to the sun: There are very mature databases available that portray the location of the sun as a function of the time of the year and geographical location of the concentrator. This embodiment may be self sustaining and can work independently, and all the information required to align the concentrator are resident in the database software in the concentrator. In addition, there is a simple comparator which will receive periodic signals either though GPS receiver from the GPS satellite, or from the atomic clock, and then align the concentrator to the sun in order to obtain maximum efficiency and output from the concentrator system.

Material and means to deposit/spray anti-sticking material onto the concentrator surface against bird droppings and other man-made or non-man-made unwanted deposits on the surface of the concentrator system, by periodic checking of the output of the concentrator through a monitoring device and/or sensing device output and/or output of the concentrator system, and then taking corrective action which may mean releasing/cleaning/wiping/spraying the anti-sticking coating material or cleaning agent onto the surface of the concentrator system.

Robot that periodically will clean and/or spray the surface of the concentrator, such as a windshield wiper of a car: This periodic cleaning/wiping can be as a function of time and/or as a function of the sun intensity onto the concentrator, which can be sensed by a sensor or acted on through a servo controller, which monitors the output and adjusts the input (adjusting the input can mean triggering an action to wipe off the surface of the concentrator and/or spraying on the surface of the concentrator in order to provide additional and better sun irradiance onto the surface of the concentrator and hence get higher output from the concentrator system).

Photosynthesis, electrolysis (separating hydrogen for fuel cells) and boiler/steam power generator, and water distillation (such as separation of salt from sea/ocean water by applying intensified sun energy onto a container but not limited to a container and using/monetizing the steam power and salt as the residue of this action) should be mentioned as uses or applications of a concentrator. This is in addition to concentrating the sunlight onto the solar concentrator cell for producing electrical energy from sunlight energy.

Make-Up and Advantages of the Multi-Element Solar Concentrating System as an Example:

It consists of an array of thousands of relatively small flat glass mirrors.

The mirrors that reflect the sunlight move (tilt) in two dimensions to follow the sun during the day and during the seasons, the glass used in the mirrors is less expensive because it is nearly flat, not curved, and solar fields can be installed on uneven or sloping ground.

Inverter Attributes should be:

Fast Maximum Power Point Tracking (MPPT) process

High efficiency achieved through robust power train and control architecture

Elimination of cascaded power failure throughout the PV system

Simplification of Balance of System

Low cost installation

Easy integration to Building Integrated Photovoltaic Systems

Magnetic Powered Apparatus for Actuating the Mirrors:

The importance of correct dimensioning of the armature magnet cannot be overemphasized. If it is either too long or too short, it could achieve an undesirable equilibrium condition that would stall movement. The objective is to optimize all force conditions to develop the greatest possible off-balance condition, but always in the same direction as the armature magnet moves along the row of stator magnets. However, if the armature is rotated 180 degrees and started at opposite end of the track, it would behave in the exact same manner except that it would in this example move from left to right. Also, note that once the armature is in the motion, it has momentum that helps carry it into the sphere of influence of the next pair of magnets where it gets another push and pull and additional momentum. This was addressed by the prior art. Computer analysis and feedback system can help provide vital feedback information that greatly helps in the effort to optimize these complex forces to achieve the most efficient possible operating design. The applications of such an apparatus include but is not limited to what is originally intended to be and can certainly expand to cars, planes, trains, generators, motors, power plants, photosynthesis, electrolysis (separating hydrogen for fuel cells) and boiler/steam power generator but not limited to these as uses or applications of the magnetically aligned solar concentrating system.

The $/w and/or $/kWhr figure of merits will be satisfied and reduced significantly in order to avail the energy at significantly lower cost than even the nuclear and/or coal sources of energies. We are expecting under 1.7 cents/kWhr of energy production with our design and system.

Pressurized Caverns:

The great limiting factor of solar power, of course, is that it generates little electricity when skies are cloudy and none at night. Excess power must therefore be produced during sunny hours and stored for use during dark hours. Most energy storage systems such as batteries are expensive or inefficient. Compressed-air energy storage has emerged as a successful alternative. Electricity from photovoltaic plants, such as the system proposed in this patent application, compresses air and pumps it into vacant underground caverns, abandoned mines, aquifers and depleted natural gas well. The pressurized air is released on demand to turn a turbine that generates electricity, aided by burning small amounts of natural gas. This is also addressed by the prior art.

Large utility power plants require in excess of 1 GW of output which will provide for (e.g. based on Germany's feed in tariff rates of 50 cents/kWhr to 75 cents/kWhr, $/W figures equate to ~$10/W to $15/W) $10 B to $15 B of revenue stream. A typical 4 bedroom 2½ bathroom house in California approximately uses 2 Mwhrs of electricity on an average basis for a cost of approximately $240/month or ~12 cents/kWhr based on traditional energy supplies, such as coal or nuclear, which means 1 GW of output power will satisfy power requirements of ~10 million 4 bedroom 2½ bathroom houses. At 500 suns, each 1×1 $cm^2$ 35% efficient multi junction solar concentrator cell provides for approximately 15 watts, therefore, one will need 1 GW/15 W=66.7 Million 1×1 $cm^2$ cells, to provide for 1 GW of output, or 1.34 Million 4 inch triple junction concentrator cells with 62% yield, or 50 MOCVD reactors, at a cost of $3 Million each, for a total of $150M. This throughput can be satisfied with only one production solid phase epitaxy reactor, at a cost of $7 Million for the reactor, which is more than 21 times less capital intensive and costly than its competition, which is MOCVD reactor.

In one embodiment, the system comprises of an array of inverters. An alternative method uses an array of target elements or linear elements above the array of concentrator elements. In another embodiment, we can use laser or wireless technology to transfer the energy. The system can also manage, switch, bill, or regulate the energy.

Any variations of the above teaching are also intended to be covered by this patent application.

The invention claimed is:

1. A system for concentrating sunlight for energy recovery, storage, or production, said system comprising:
    an array of reflective elements;
    at least two photodetectors;
    a differential tracker;
    a tracking and control processor;
    an X-direction control processor;
    a Y-direction control processor; and
    a target;
wherein each of said array of reflective elements comprises:
    a rigid slab;
    a tilt mechanism;
wherein said tilt mechanism comprises:
    an X-direction actuation mechanism;
    a Y-direction actuation mechanism;
wherein said two photodetectors are located at a distance from each other;
wherein said target converts sunlight to other forms of energy;
wherein said rigid slab comprises a conductive material that has a reflective top surface;
wherein said tilt mechanism tilts said rigid slab;
wherein said two photodetectors are connected to said differential tracker;
wherein said differential tracker generates a differential signal or adjustment signal related to or proportional to the signals from said two photodetectors;

wherein said differential signal is fed to said tracking and control processor;
wherein said tracking and control processor generates an X-signal and a Y-signal that is fed to said X-direction control processor and said Y-direction control processor, respectively;
wherein said X-direction control processor generates −X and +X signals;
wherein said Y-direction control processor generates −Y and +Y signals;
wherein said −X and +X signals are fed to said X-direction actuation mechanism;
wherein said −Y and +Y signals are fed to said Y-direction actuation mechanism; and
wherein said rigid slab is tilted by said X-direction actuation mechanism and said Y-direction actuation mechanism.

2. A system as recited in claim 1, wherein said array of reflective elements are mounted on a flat slab;
wherein said flat slab comprises:
a sun tracking system;
wherein said sun tracking system gets its signal from said differential tracker;
wherein said sun tracking system moves said slab to track the sun.

3. A system as recited in claim 1, wherein said target comprises:
an array of point targets;
wherein said array of point targets is one or two dimensional;
wherein said array of point targets is located at a predetermined distance above said array of reflective elements;
wherein each of said reflective elements reflects the sunlight on one or more elements of said array of point targets, at any given instant of time.

4. A system as recited in claim 1, wherein said target comprises:
an array of linear targets;
where is said array of linear targets is one or two dimensional;
wherein said array of linear targets is located at a predetermined distance above said array of reflective elements;
wherein each of said reflective elements reflects the sunlight on some part of said array of linear targets.

5. A system as recited in claim 1, wherein said tilt mechanism is an electrostatic mechanism that generates electrostatic forces when it receives electrical voltage;
wherein said rigid slab is made of a conductive material;
wherein said rigid slab is tilted by motors, and
each of said array of reflective elements is tilted by said electrostatic field.

6. A system as recited in claim 1, wherein said tilt mechanism is an electromagnetic mechanism that generates magnetic force when it receives electrical current;
wherein said rigid slab, its component, or its core is made of ferromagnetic material;
wherein said rigid slab is tilted by said magnetic field.

7. A system as recited in claim 1, wherein said tilt mechanism is a servo mechanism that moves said rigid slab by an electric motor.

8. A system as recited in claim 1, wherein said tilt mechanism is a hydraulic mechanism.

9. A system as recited in claim 1, wherein said tilt mechanism is a servo mechanism that moves said rigid slab by a step motor.

10. A system as recited in claim 1, wherein said tilt mechanism is based on a Shape Memory Alloy that changes shape due to heat, current or other excitations.

11. A system as recited in claim 1, wherein said tilt mechanism uses a feedback mechanism to align said reflective element toward the sun.

12. A system as recited in claim 1, wherein said target is a solar cell.

13. A system as recited in claim 1, wherein said target is a fuel cell reactor.

14. A system as recited in claim 1, wherein said target is a photosynthesis element.

15. A system as recited in claim 1, wherein said target is a fluid heating reservoir or pipe filled with running fluid.

16. A system as recited in claim 1, wherein said target is a water heating reservoir or pipe filled with running water.

17. A system as recited in claim 1, wherein said target is an oil heating reservoir or pipe filled with running oil.

18. A system as recited in claim 1, wherein said target is a water heating reservoir or pipe filled with running steam.

19. A system as recited in claim 1, wherein said system comprises of an array of or two or more inverters.

20. A system as recited in claim 1, wherein said system is airborne, space-borne, or floating in the air or space.

21. A system for concentrating sunlight for energy recovery, storage, or production, said system comprising:
an array of refractive elements;
at least two photodetectors;
a differential tracker;
a tracking and control processor;
an X-direction control processor;
and a Y-direction control processor;
a target;
wherein each of said array of refractive elements comprises:
a rigid slab;
a tilt mechanism;
wherein said rigid slab has a hole that holds the refractive element in the middle;
wherein said tilt mechanism comprises:
an X-direction actuation mechanism;
a Y-direction actuation mechanism;
wherein said at least two photodetectors are located at a distance from each other;
wherein said target converts sunlight to other forms of energy;
wherein said tilt mechanism tilts said rigid slab;
wherein said two photodetectors are connected to said differential tracker;
wherein said differential tracker generates a differential signal proportional to or related to the difference of the angle of sun rays to said two photodetectors, or to the relative position of said two photodetectors;
wherein said differential signal is fed to said tracking and control processor;
wherein said tracking and control processor generates an X-signal and a Y-signal that is fed to said X-direction control processor and said Y-direction control processor, respectively;
wherein said X-direction control processor generates −X and +X signals;
wherein said Y-direction control processor generates −Y and +Y signals;
wherein said −X and +X signals are fed to said X-direction actuation mechanism;
wherein said −Y and +Y signals are fed to said Y-direction actuation mechanism; and
wherein said rigid slab is tilted by said X-direction actuation mechanism and said Y-direction actuation mechanism.

22. A system as recited in claim 21, wherein said array of refractive elements are mounted on a flat slab;
wherein said flat slab comprises:

a sun tracking system;
wherein said sun tracking system gets its signal from said differential tracker;
wherein said sun tracking system moves said slab to track the sun.

23. A system as recited in claim 21, wherein said target comprises:
an array of point targets;
wherein said array of point targets is one or two dimensional;
wherein said array of point targets is located at a predetermined distance below said array of refractive elements;
wherein each of said refractive elements concentrate the sunlight on one or more elements of said array of point targets, at any given instant of time.

24. A system as recited in claim 21, wherein said target comprises:
an array of linear targets;
where is said array of linear targets is one or two dimensional;
wherein said array of linear targets is located at a predetermined distance above said array of refractive elements;
wherein each of said refractive elements reflects the sunlight on some part of said array of linear targets.

25. A system as recited in claim 21, wherein said tilt mechanism is an electrostatic mechanism that generates electrostatic forces when it receives electrical voltage;
wherein said rigid slab is made of a conductive material;
wherein said rigid slab is tilted by motors, and each of said array of reflective elements is tilted by said electrostatic field.

26. A system as recited in claim 21, wherein said tilt mechanism is an electromagnetic mechanism that generates magnetic field when it receives electrical voltage, or is based on a permanent magnet; wherein said rigid slab or its component is made of a ferromagnetic material;
wherein said rigid slab is tilted by said magnetic field.

27. A system as recited in claim 21, wherein said tilt mechanism is a servo mechanism that moves said rigid slab by an electric motor.

28. A system as recited in claim 21, wherein said tilt mechanism is a hydraulic mechanism.

29. A system as recited in claim 21, wherein said tilt mechanism is a servo mechanism that moves said rigid slab by a step motor.

30. A system as recited in claim 21, wherein said tilt mechanism is based on a Shape Memory Alloy that changes shape due to heat, current or other excitations.

31. A system as recited in claim 21, wherein said tilt mechanism uses a feedback mechanism to align said refractive element toward the sun.

32. A system as recited in claim 21, wherein said target is a solar cell.

33. A system as recited in claim 21, wherein said target is a fuel cell reactor.

34. A system as recited in claim 21, wherein said target is a photosynthesis element.

35. A system as recited in claim 21, wherein said target is a fluid heating reservoir or pipe filled with running fluid.

36. A system as recited in claim 21, wherein said target is a water heating reservoir or pipe filled with running water.

37. A system as recited in claim 21, wherein said target is an oil heating reservoir or pipe filled with running oil.

38. A system as recited in claim 21, wherein said target is a water heating reservoir or pipe filled with running steam.

39. A system as recited in claim 21, wherein said system comprises of an array of inverters.

40. A system as recited in claim 21, wherein said system is airborne, space-borne, or floating in the air or space.

41. A system as recited in claim 1, wherein said system comprises a rough alignment and a fine alignment mechanism.

42. A system as recited in claim 1, wherein said system comprises a multiple-step alignment mechanism.

43. A system as recited in claim 1, wherein said system comprises a multiple-feedback alignment mechanism.

44. A system as recited in claim 1, wherein said system uses a database or table information to align said reflective element toward the sun.

45. A system as recited in claim 1, wherein said system uses a training data or history or prior information to align said reflective element toward the sun.

46. A system as recited in claim 1, wherein said system uses z axis, moving in a third dimension, to move up and down.

47. A system as recited in claim 1, wherein said system uses time as a variable or parameter in the aligning or optimization of said system.

48. A system as recited in claim 1, wherein said system transfers energy, regulates energy, switches, stores, or manages energy.

49. A system as recited in claim 1, wherein said system uses wireless or laser technology to transfer energy.

50. A system as recited in claim 1, wherein said system uses steam to store energy.

51. A system as recited in claim 1, wherein said system uses compressed gasses to store energy.

52. A system as recited in claim 1, wherein said system uses error correction codes or algorithms to steer, optimize, or align the elements.

53. A system as recited in claim 1, wherein said system uses an intelligent element controller, for tilting and moving, based on neural networks, feedback, or history.

54. A system as recited in claim 1, wherein said system uses a structure in a shape of a polygon for elements, to absorb and convert energy.

55. A system as recited in claim 1, wherein said system uses pipes in a zigzag shape, for heating devices.

56. A system as recited in claim 1, wherein said system uses multiple layers for heating devices.

57. A system as recited in claim 1, wherein said system uses multiple gasses, fluids, or liquids, or their mixtures, circulating, for heating devices.

58. A system as recited in claim 1, wherein said system uses the absorption parameters or electrical activity, to find problems, pinpoint locations, and fix the problems, for heating devices.

59. A system as recited in claim 1, wherein said system uses the absorption parameters or electrical activity, to find problems, pinpoint locations, and fix the problems, for elements, to absorb and convert energy.

60. A system as recited in claim 1, wherein said system uses moon light or other sources of light, at night or other times, to absorb energy, for storage, usage, or transmission.

* * * * *